United States Patent [19]
Ushikoshi et al.

[11] Patent Number: 6,057,513
[45] Date of Patent: May 2, 2000

[54] JOINT STRUCTURE OF METAL MEMBER AND CERAMIC MEMBER AND METHOD OF PRODUCING THE SAME

[75] Inventors: Ryusuke Ushikoshi, Tajimi; Hideyoshi Tsuruta, Tokai; Tomoyuki Fujii, Nagoya, all of Japan

[73] Assignee: NGK Insulators, Ltd., Japan

[21] Appl. No.: 09/013,199

[22] Filed: Jan. 26, 1998

[30] Foreign Application Priority Data

Jan. 29, 1997 [JP] Japan .................................... 9-015384
Nov. 25, 1997 [JP] Japan .................................... 9-322570

[51] Int. Cl.[7] ................................................. H05K 1/16
[52] U.S. Cl. ......................... 174/260; 174/261; 361/234; 361/748; 29/843; 279/128; 257/700
[58] Field of Search .................................. 174/261, 68.1, 174/260, 266; 361/748, 234; 29/843; 279/128; 257/700, 701, 703

[56] References Cited

U.S. PATENT DOCUMENTS

| | | | |
|---|---|---|---|
| 5,051,811 | 9/1991 | Williams et al. | 357/68 |
| 5,077,115 | 12/1991 | Arthur et al. | 428/137 |
| 5,160,999 | 11/1992 | Opitz | 257/702 |
| 5,352,629 | 10/1994 | Paik et al. | 437/189 |
| 5,541,368 | 7/1996 | Swamy | 174/266 |
| 5,668,524 | 9/1997 | Aida et al. | 338/308 |
| 5,777,838 | 7/1998 | Tamagawa et al. | 361/234 |
| 5,812,361 | 9/1998 | Jones et al. | 361/234 |
| 5,815,366 | 9/1998 | Morita et al. | 361/234 |

FOREIGN PATENT DOCUMENTS

| | | | |
|---|---|---|---|
| 569799A2 | 11/1993 | European Pat. Off. | 257/701 |
| 618757A1 | 10/1994 | European Pat. Off. | 29/843 |
| 0 726 238 A2 | 8/1996 | European Pat. Off. | |
| 0 726 239 A2 | 8/1996 | European Pat. Off. | |

OTHER PUBLICATIONS

Patent Abstracts of Japan, vol. 014, No. 459, Oct. 4, 1990 & JP 02 188475 A, Jul. 24, 1990 Abstract.
Patent Abstracts of Japan, vol. 014, No. 253 (P–1054), May 30, 1990 & JP 02 067508 A, Mar. 7, 1990 Abstract.
Patent Abstracts of Japan, vol. 009, No. 226, Sep. 12, 1985, & JP 60 082267 A, May 10, 1985 Abstract.

*Primary Examiner*—Kristine Kincaid
*Assistant Examiner*—Dhiru R Patel

[57] ABSTRACT

A joint structure having a metal member and a ceramic member having a housing hole for accommodating at least a part of the metal member therein, in which an electrically conductive joint layer is formed between a bottom face of the metal member and a bottom face of the housing hole, and a film having a given wettability by the electrically conductive joint layer is formed on at least a part of the side wall face of the metal member.

8 Claims, 9 Drawing Sheets

FIG.-1
Comparative

FIG_8a

FIG_8b

FIG_9a

FIG_9b

FIG_9c

JOINT STRUCTURE OF METAL MEMBER AND CERAMIC MEMBER AND METHOD OF PRODUCING THE SAME

BACKGROUND OF THE INVENTION

1. Field of the Invention

This invention relates to a joint structure of a metal member and a ceramic member, and a method of producing the same.

2. Description of Related Art

At present, an electrostatic chuck is used for attracting and holding a semiconductor wafer in a transportation of the semiconductor wafer, film forming processes such as exposure to light, chemical vapor deposition (CVD), sputtering and the like, or steps of micromachining, cleaning, etching, dicing and the like. As a substrate for the electrostatic chuck, dense ceramics have been watched. Particularly, a corrosive halogen type gas such as $ClF_3$ or the like is frequently used as an etching gas or a cleaning gas in an apparatus for the manufacture of the semiconductor. Furthermore, the substrate for the electrostatic chuck is desired to have a high thermal conductivity for rapidly heating and cooling the semiconductor wafer at a holding state. And also, it is desired to have a thermal shock resistance so as not to cause the breakage of the substrate due to a rapid temperature change. In this connection, a dense aluminum nitride, alumina and the like have a high corrosive resistance against the aforementioned corrosive halogen type gas.

Moreover, a susceptor provided with a high frequency electrode therein for generating plasma is put into practical use in the field of semiconductor-manufacturing apparatus. Even in the field of such an apparatus for generating high frequency power, a metal electrode is embedded in the substrate of aluminum nitride, alumina or the like.

In these apparatuses, it is necessary that the metal electrode is embedded in the ceramic substrate of aluminum nitride, alumina or the like and electrically connected to an external connector for supplying electric power. However, such a connecting portion is exposed to heat cycle of extremely high and low temperatures in an oxidizing atmosphere or further in a corrosive gas atmosphere. Even in such bad conditions, therefore, the connecting portion is desired to hold a high joint strength and a good electrical connection over a long period of time.

The inventors have already proposed a technique of manufacturing a ceramic heater, an electrostatic chuck or a high frequency electrode device used in the semiconductor-manufacturing apparatus, wherein a hole is made by machining in a substrate of aluminum nitride, silicon nitride or the like, and a metal electrode in the inside of the substrate is exposed from the hole, and a cylindrical fitting is inserted into the hole, and a top face of the metal fitting is brazed to the metal electrode (Japanese Patent Application No. 7-21657).

However, it has been confirmed that this technique has still the following problems. Namely, there are some cases that a given joint strength and electrical conductivity can not be ensured and hence the yield is lowered. For example, when the top face of the cylindrical metal fitting is brazed to the bottom face of the housing hole formed in the ceramic substrate, there may be caused a case that a sufficient amount of a brazing material is not retained in a joint portion of the housing hole because the brazing material extremely rises toward the side of the metal fitting through wetting. For this reason, it tends to lower a strength when stress is applied to the metal fitting.

SUMMARY OF THE INVENTION

It is, therefore, an object of the invention to improve a joint strength of a metal member in a joint structure of a metal member and a ceramic member having a housing hole for accommodating at least a part of the metal member therein.

According to the invention, there is a provision of a joint structure of a metal member and a ceramic member having a housing hole for accommodating at least a part of the metal member therein, characterized in that the metal member is accommodated in the housing hole, an electrically conductive joint layer joining the metal member to the ceramic member is formed between a bottom face of the metal member and a bottom face of the housing hole, and a film which is less wet with the electrically conductive joint layer than a metal constituting the metal member thereby is formed on at least a part of side wall face of the metal member, and a method of producing the same.

BRIEF DESCRIPTION OF THE DRAWINGS

The invention will be described with reference to the accompanying drawings, wherein:

FIG. 8b is a perspective view of a reticulate electrode 2 to be embedded in the ceramic member 1 shown in FIG. 8a.

DESCRIPTION OF PREFERRED EMBODIMENTS

Figure 1:
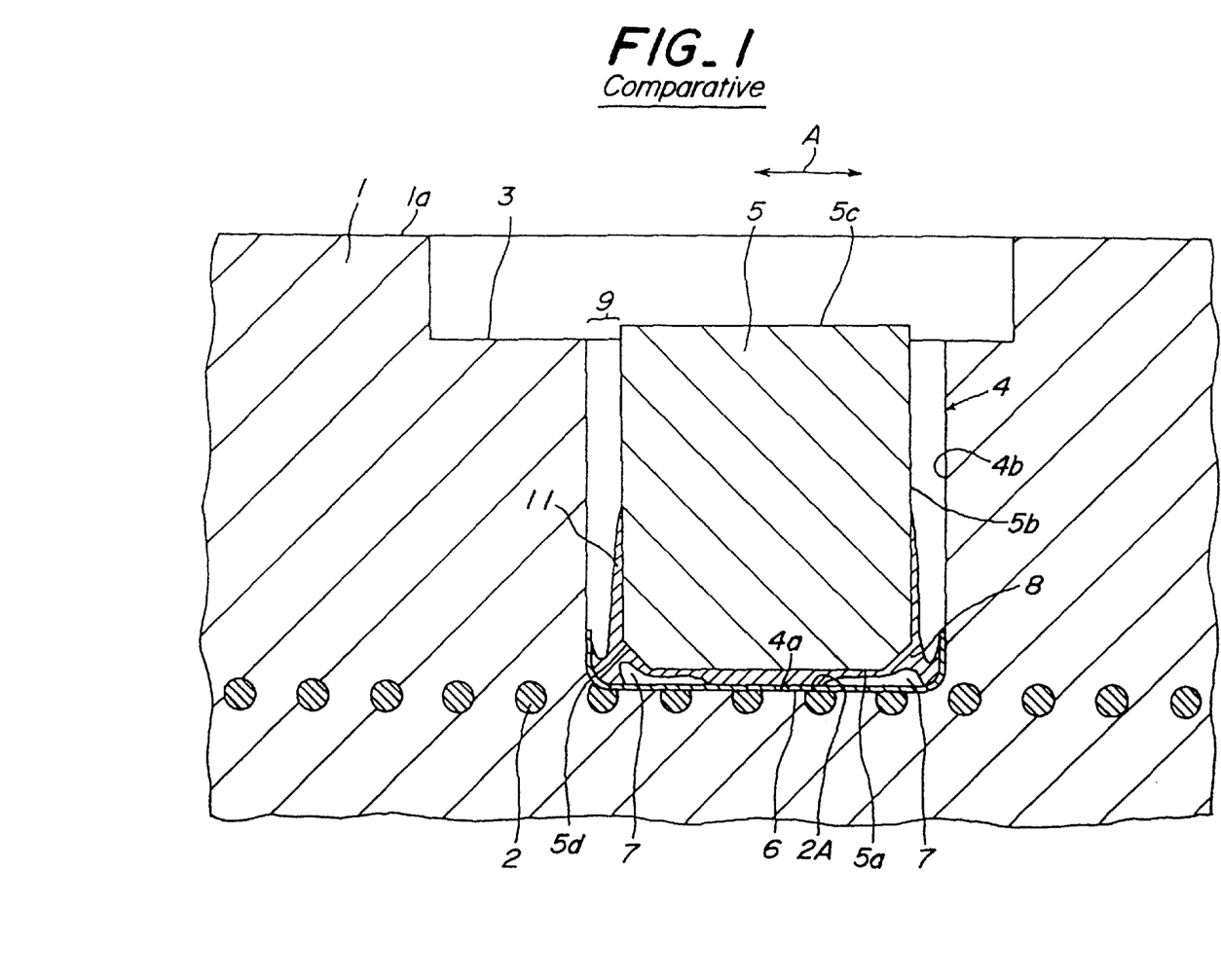
FIG. 1 is a diagrammatically section view of a joint structure as a comparative example examined by the inventors.

At first, the inventors have made an experiment of joining a metal member 5 to a ceramic member 1 having a configuration as shown in FIG. 1. In this case, a reticulate electrode 2 as mentioned later is embedded in the ceramic member 1 to be integrally sintered. And also, a circular concave portion 3 is formed in a back surface 1a of the ceramic member 1, and further a housing hole 4 having substantially a circular shape at its lateral section is formed in an inside of the concave portion 3. In the illustrated embodiment, a metal foil 6 is formed so as to cover a bottom face 4a of the housing hole 4 and a portion of a side wall surface 4b near to the bottom face thereof prior to the insertion of a cylindrical metal member 5 into the housing hole 4.

A plate-shaped brazing material is interposed between a bottom face 5a of the metal member 5 and the bottom face 4a of the housing hole 4 opposite thereto. And also, a little gap is existent between a side wall face 5b of the metal member 5 and a side wall face 4b of the housing hole 4.

When brazing is carried out at such a state, it is succeeded to join the metal member 5 to the ceramic member 1 through an electrically conductive joining layer 8 made of the brazing material as shown in FIG. 1. However, there may be caused a case of lowering the joint strength of the metal member 5, particularly the joint strength against stress applied in a direction of an arrow A, and a case of raising an electrical resistance of the joint portion to cause heat generation. Further, when being exposed to a higher temperature in air, the reticulate electrode 2 is oxidized and hence the joint strength and electrical conductivity considerably lower.

The inventors have examined reasons on these problems and noticed that a part of the brazing material rises up in the gap 9 between the side wall face 5b of the metal member 5 and the side wall face 4b of the housing hole 4 in the brazing step. That is, since the fluidity of the brazing material is caused in the brazing, the brazing material is fluidized by a little load applied to the metal member 5 and own weight of the metal member 5 and flows toward a peripheral edge portion of the housing hole 4. In general, the ceramic member, particularly aluminum nitride member becomes hardly wettable by the brazing material, so that the surface of the ceramic member is made wettable by the brazing material by covering the surface of the ceramic member with a metal foil 6. Thus, a part of the brazing material flowing on the bottom face 4a of the housing hole 4 toward the side wall face 4b thereof rises along the metal foil 6.

However, a greater part of the brazing material tends to flow upward along the side wall face 5b of the metal member 5 and wet the side wall face 5b. As a result, there is a tendency to create a brazing material layer 11 upward along the side wall face 5b. Such a brazing material layer 11 hardly contributes to increase the joint strength of the metal member 5. And also, the brazing material to be originally packed between the bottom face 5a of the metal member 5 and the bottom face 4a of the housing hole 4 is pulled upward to create a shrinkage cavity 7 accompanied with the formation of the brazing material layer 11. As a result, it is considered that the joint strength of the metal member 5 is lowered by the shrinkage cavity 7. Furthermore, it is considered that the reticulate electrode 2 may be exposed by the shrinkage cavity 7 and oxidized when being exposed to a higher temperature in air. Moreover, it is considered that when the reticulate electrode 2 is exposed to a corrosive gas such as halogen gas or the like at a high temperature, it is liable to be corroded.

The inventors have further studied such a joint structure and then reached a joint structure according to the preset invention as mentioned later.

Figure 2A:
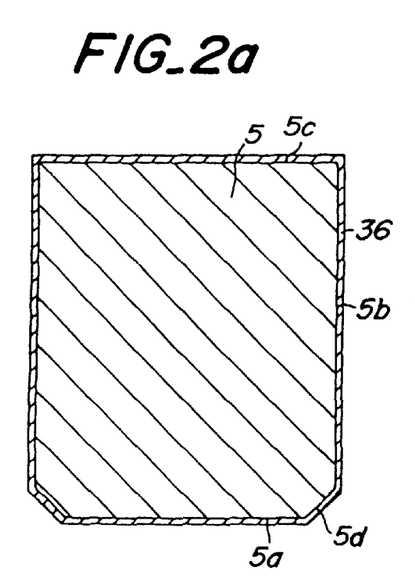
FIG. 2a is a section view of an embodiment of a metal composite member comprising a metal member 5 and a film 36 formed on a surface of the metal member.

As shown in FIG. 2a, a film 36 which is less wet with an electrically conductive joint material such as a brazing material or the like than a surface of the metal member thereby is formed on a bottom face 5a, a side wall face 5b, a top face 5c and a C-chamfered face 5d of the metal member 5. A metal oxide film is preferable as such a film, but a film made from a material which is less wet with the electrically conductive joint material than a metal of the metal member 5 thereby may be used. In the metal member, a round-chamfered face may be used instead of the C-chamfered face.

Then, a part of the film 36 is removed out to expose a part of the surface of the metal member 5 in order to maintain the wettability of the metal member by the electrically conductive joint material. That is, it is necessary to remove out the film 36 from at least a portion of the side wall face 5b of the metal member 5 near to the bottom face 5a thereof. When the metal member 5 is used as an electric power supply member, it is particularly preferable to remove the film 36 from at least top face 5c and bottom face 5a of the metal member 5 for reducing the electrical resistance of the metal member 5.

Figure 2B:
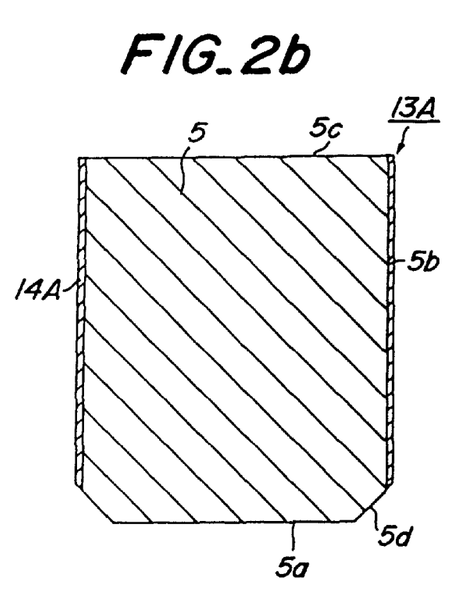
FIG. 2b is a section view of another embodiment of a metal composite member 13A.
Figure 2C:
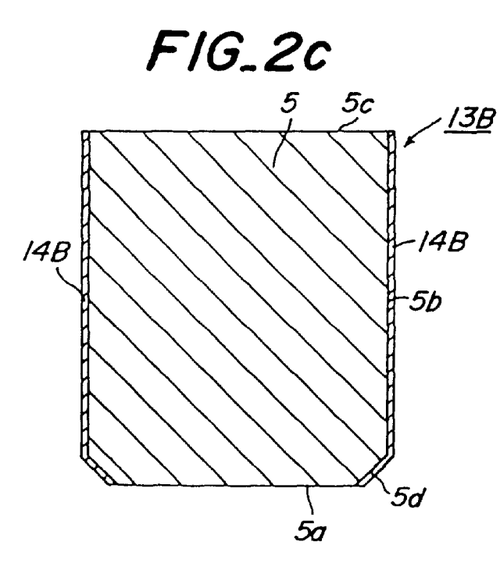
FIG. 2c is a section view of the other embodiment of a metal composite member 13B.

Preferably, a metal composite member 13A is obtained by removing the film 36 from the top face 5c, bottom face 5a and C-chamfered face 5d of the metal member 5 so as to leave a film 14A on the side wall face 5b as shown in FIG. 2b. Alternatively, a metal composite member 13B is obtained by removing the film 36 from the top face 5c and bottom face 5a of the metal member 5 so as to leave a film 14B on the side wall face 5b and C-chamfered face 5d as shown in FIG. 2c.

Figure 3:
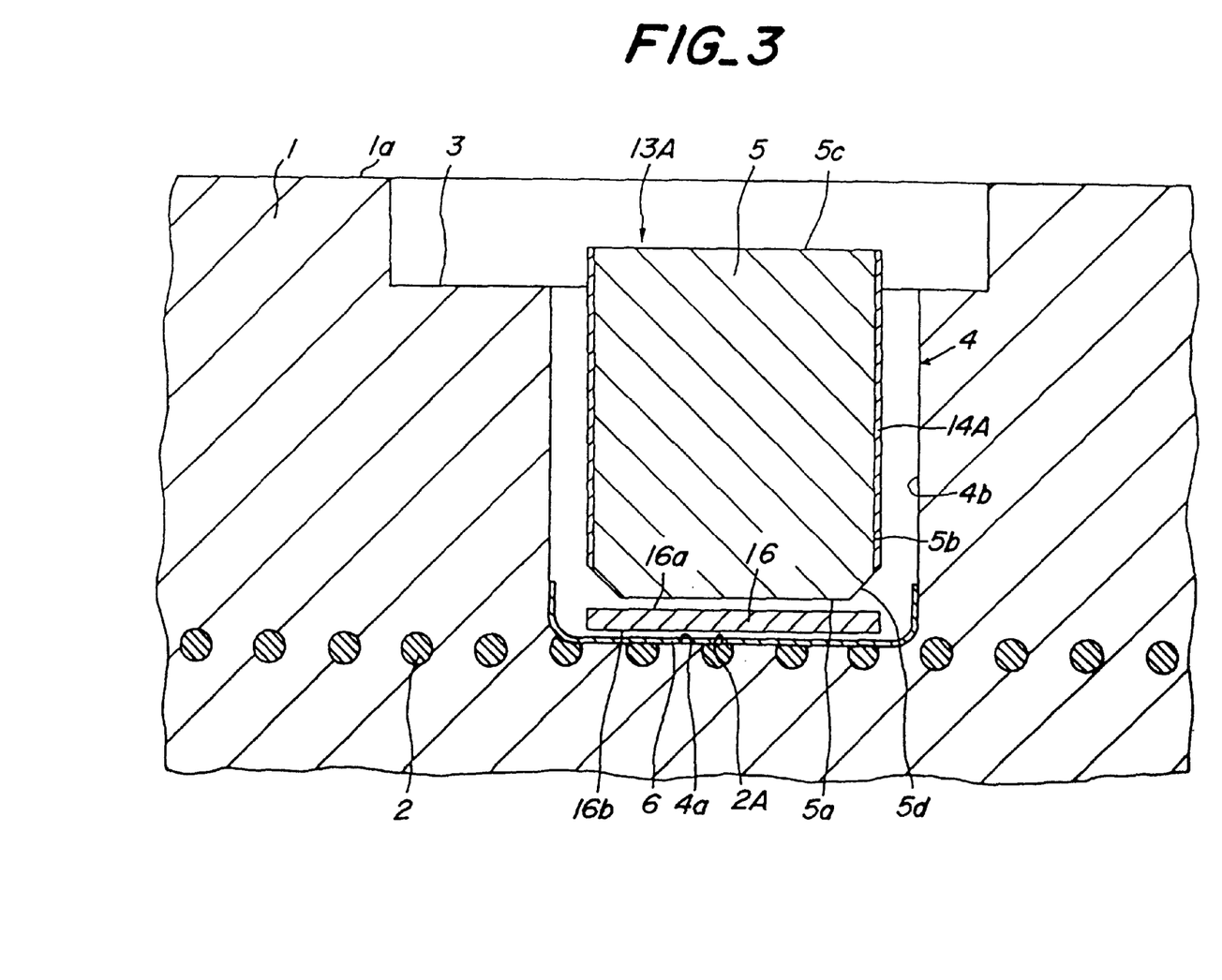
FIG. 3 is a diagrammatically section view illustrating a state before the manufacture of an embodiment of the joint structure shown in FIG. 4 according to the invention.

As shown in FIG. 3, the metal composite member 13A is inserted into the housing hole 4 to oppose the bottom face 5a of the metal member 5 to the electrically conductive joint material 16 such as brazing material or the like. The ceramic member 1 to be joined in this embodiment will be described below.

Figure 8A:
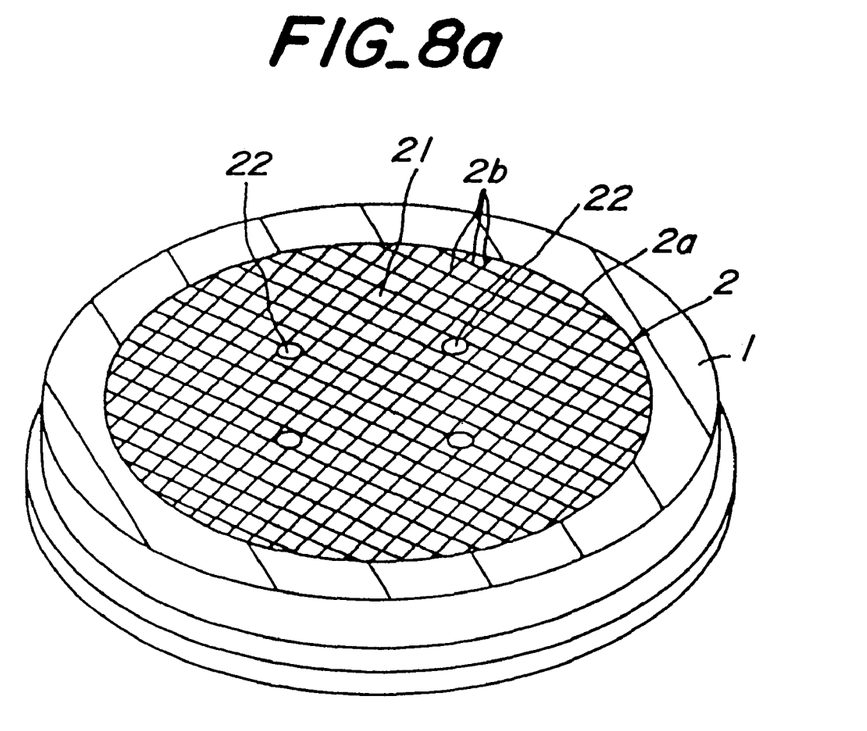
FIG. 8a is a partly broken perspective view of a ceramic member 1 applied to the joint structures shown in FIGS. 3–6.
Figure 8B:
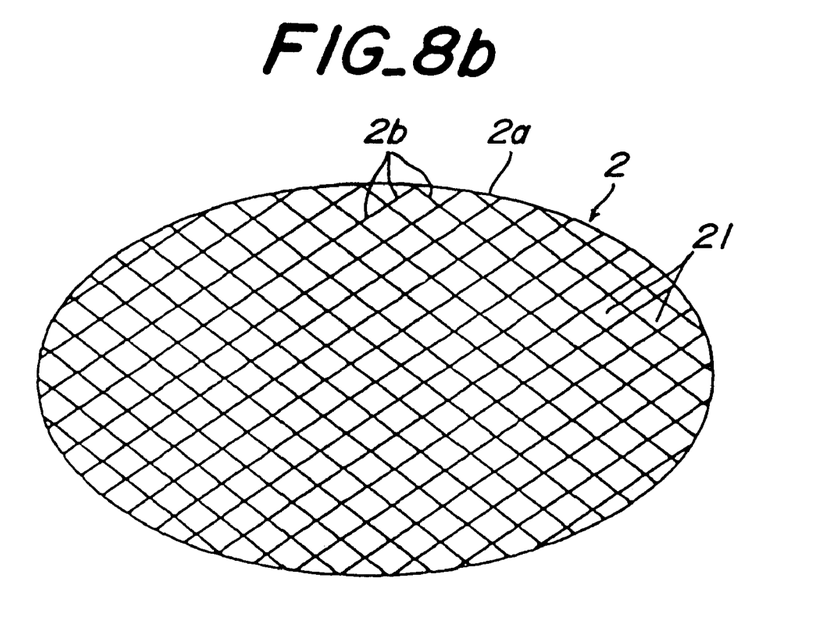

As shown in FIGS. 8a and 8b, the reticulate electrode 2 is embedded in the ceramic member 1. The electrode 2 comprises a substantially circular metal wire 2a constituting the outer periphery of the electrode 2 and metal wires 2b reticulated inside the metal wire 2a, in which meshes 21 are formed between the metal wire 2a and the metal wire 2b and among plural metal wires 2b. Moreover, numerals 22 are through-holes passing pins for the support of a semiconductor wafer, respectively.

In FIG. 3, a part 2A of the reticulate electrode 2 comprised of an electrically conductive member is exposed from the bottom face 4a of the housing hole 4. A surface 16b of the electrically conductive joint material 16 is opposed to the bottom face 4a of the housing hole 4 and the exposed portion 2A of the electrode 2, while the bottom face 5a of the metal composite member 13A is opposed to another surface 16a of the electrically conductive joint material 16. A joint structure as shown in FIG. 4 is obtained by heating them at the above state.

Figure 4:
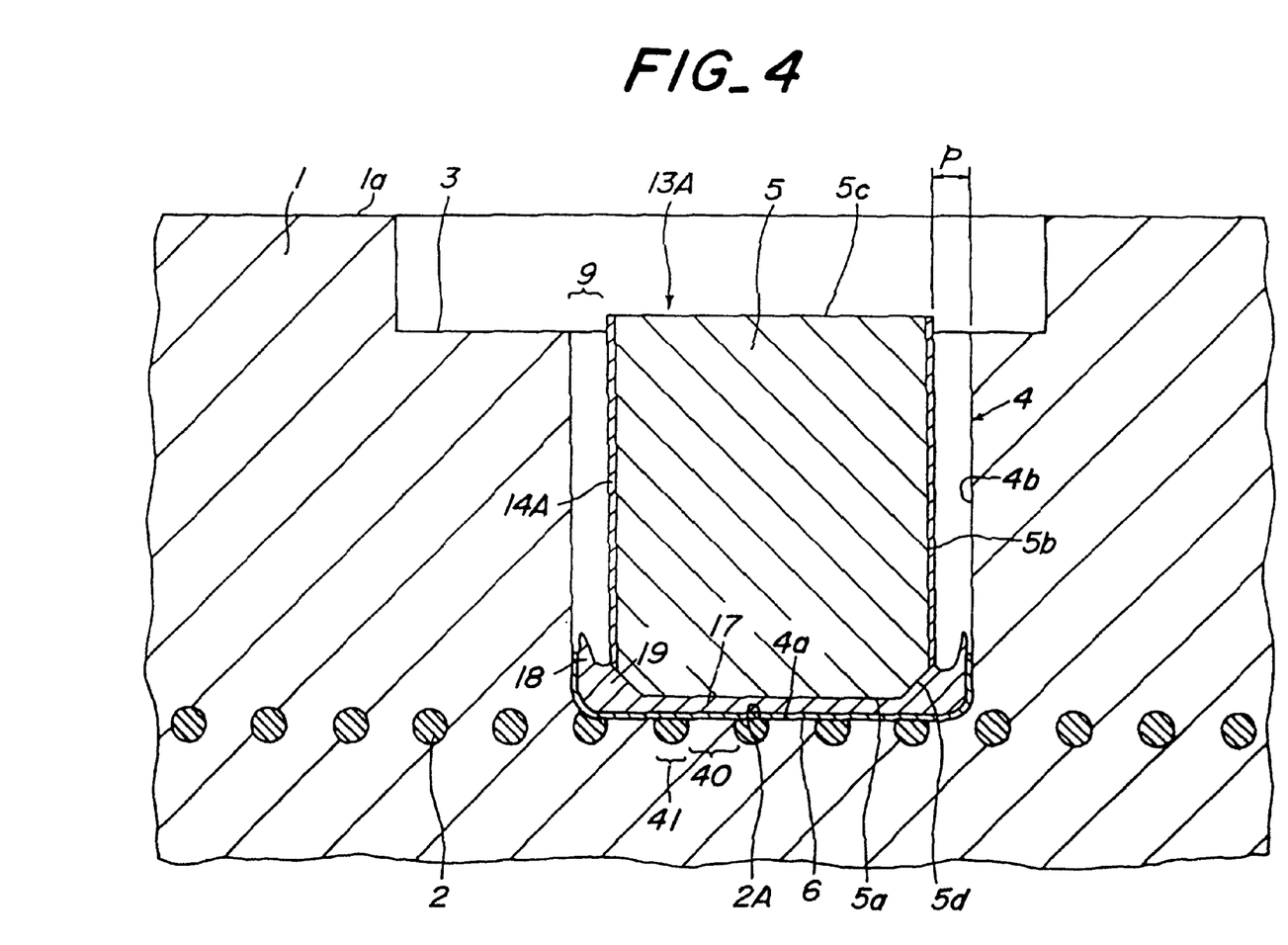
FIG. 4 is a diagrammatically section view of a first embodiment of the joint structure according to the invention.

In FIG. 4, an electrically conductive joint layer 17 is formed between the bottom face 5a of the metal composite member 13A and the bottom face 4a of the housing hole 4. The electrically conductive joint material flows while wetting the metal foil 6 located on the bottom face of the housing hole 4 in the fusion of such a joint material, so that the electrically conductive joint material flows up to substantially an end of the metal foil 6 to form a covering layer 18 made of the electrically conductive joint material.

At the same time, the electrically conductive joint material wets the bottom face 5a of the metal composite member 13A. However, the surface of the film 14A formed on the side wall face 5b of the metal member 5 becomes hardly wettable by the electrically conductive joint material, so that the electrically conductive joint material does not rise upward along the side wall face 5b of the metal composite member 13A. As a result, there can be prevented the formation of the shrinkage cavity due to the excessive flowing of the electrically conductive joint material as shown in FIG. 1.

In the invention, a part of the electrically conductive material embedded in the ceramic member is exposed from the bottom face of the housing hole accommodating the metal composite member therein, so that such an exposed portion can be joined to the electrically conductive joint layer in the joining of the ceramic member to the metal member through the electrically conductive joint layer, whereby the joint strength between the ceramic member and the metal member can be more improved. By adopting such a specific joint structure, a high joint strength can be obtained even when the ceramic member is hardly wetted by the brazing material.

In the joint structure shown in FIG. 4, a part of the reticulate electrode 2 embedded in the ceramic member 1 is exposed from the bottom face 4a of the housing hole 4 to form a partially exposed portion 2A. As a result, the partially exposed portion 2A can be join to the metal member 5 through the electrically conductive joint layer 17 (corresponding to a joint portion 41) while joining the ceramic material 1 to the electrically conductive joint layer 17 (corresponding to a joint portion 40).

Figure 5:
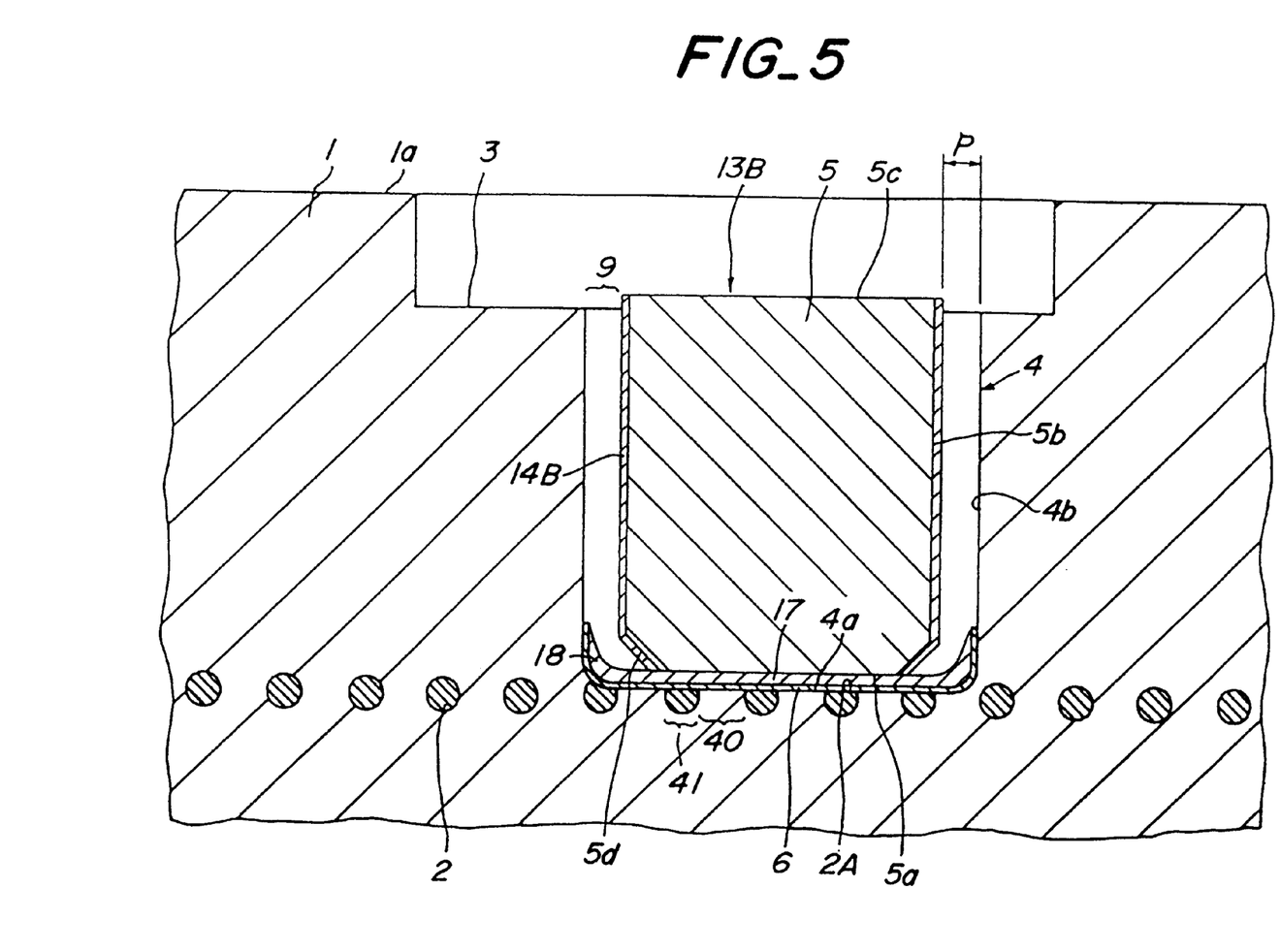
FIG. 5 is a diagrammatically section view of a second embodiment of the joint structure according to the invention.

Further, a joint structure as shown in FIG. 5 can be obtained by using the metal composite member 13B instead of the metal composite member 13A in FIG. 3. In this case, the same members as shown in FIG. 4 are given by the same numerals and the explanation thereof is omitted. In the joint structure of FIG. 5, the film 14B is formed so as to extend on the C-chamfered face 5d of the metal member 5, so that the C-chamfered face 5d is not wetted by the electrically conductive joint material and hence a covering layer 19 of the electrically conductive material as shown in FIG. 4 is not formed.

Figure 6:
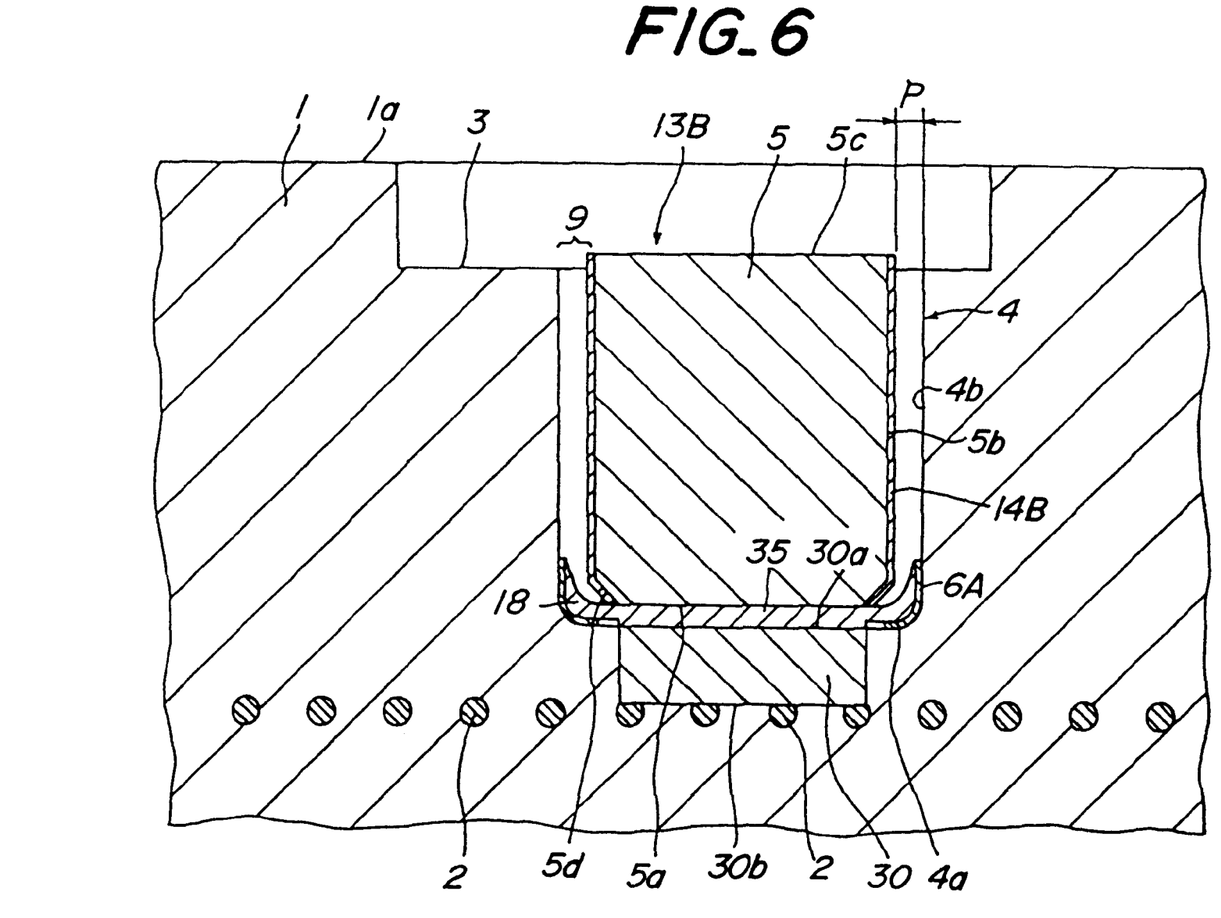
FIG. 6 is a diagrammatically section view of a third embodiment of the joint structure according to the invention.

In a joint structure of FIG. 6, a powdery sintered body 30 is embedded between the bottom face 4a of the housing hole 4 and the reticulate electrode 2. A surface 30a of the powdery sintered body 30 is joined to the metal composite member 13B through an electrically conductive joint layer 35 and the other surface 30b thereof is joined to the reticulate electrode 2 and the ceramic member respectively. In this embodiment, a metal foil 6A is arranged on a portion of the bottom face 4a of the housing hole 4 not exposing the powdery sintered body 30.

As shown in FIG. 6, it is more preferred that the powdery sintered body 30 is interposed between the electrically conductive member (or electrode) 2 embedded in the ceramic member 1 and the metal composite member 13B because a transmission path of an oxidizing gas or a corrosive gas arriving at the electrically conductive member 2 becomes long.

Figure 7:
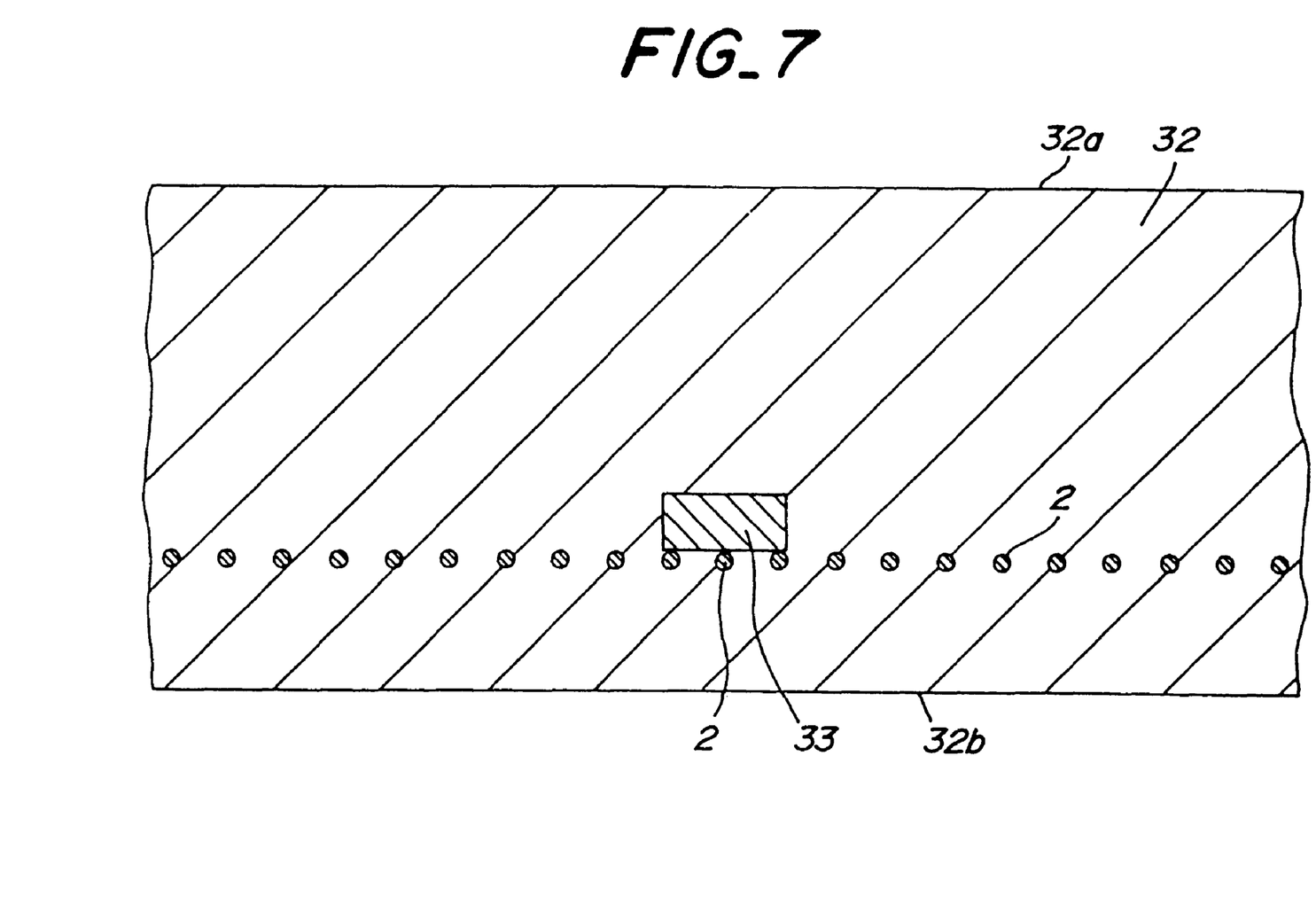
FIG. 7 is a diagrammatically section view of a shaped body 32 used for the manufacture of a ceramic member 1 shown n FIG. 6.

In order to manufacture such a joint structure, as shown in FIG. 7. a shaped body 32 made of ceramic material is prepared and then fired. In the shaped body 32 are embedded the reticulate metal electrode 2 and a shaped body 33 made of metal powder as a raw material for the powdery sintered body. In this case, numeral 32b is a side of the shaped body placing a semiconductor wafer thereon, and numeral 32a is a back side thereof. The powdery shaped body 33 is sintered by firing the shaped body 32 to form the powdery sintered body 30. Then, the housing hole 4 is formed by subjecting the resulting fired body to grinding from the back side 32a thereof.

The electrically conductive material embedded in the ceramic member is preferable to be a plate-shaped bulk material made from a high melting point metal because it is fired together with the ceramic powder. As the high melting point metal, mention may be made of tantalum, tungsten, molybdenum, platinum, rhenium, hafnium, and alloys thereof. From a viewpoint of preventing the semiconductor from contamination, the use of tantalum, tungsten, molybdenum, platinum or alloys thereof is favorable. Particularly, a metal having a thermal expansion substantially equal to that of the ceramics is preferable owing to the simultaneous firing. For example, molybdenum, tungsten and alloys thereof are preferable for aluminum nitride.

As the plate-shaped bulk material, mention may be made of the followings:

(1) A plate-shaped bulk material made of a thin sheet.

(2) A bulk material of a plate-shaped electrode having many small spaces therein. This includes a bulk material of a plate-shaped body having many small holes therein and a reticulate bulk material. A punching metal can be exemplified as the plate-shaped body having many small holes. However, when the bulk material is a punching metal of a high melting point metal, since the hardness of the high melting point metal is high, it is difficult to form many small holes in the plate of the high melting point metal by punching and the machining cost becomes extremely high. In this connection, when the bulk material is a wire mesh, a wire material of a high melting point metal is readily available, so that the wire mesh can be manufactured by knitting the wire materials.

In the wire mesh, the shape, wire diameter and the like are not specifically limited. However, 150 meshes with a wire diameter of 0.03 mm to 6 meshes with a wire diameter of 0.5 mm can be employed without problems. Moreover, a sectional shape of the wire material constituting the wire mesh in the widthwise direction may be various rolled shapes such as circle, ellipse, rectangle and the like. Here, one mesh means one wire per an inch.

Figure 9A:
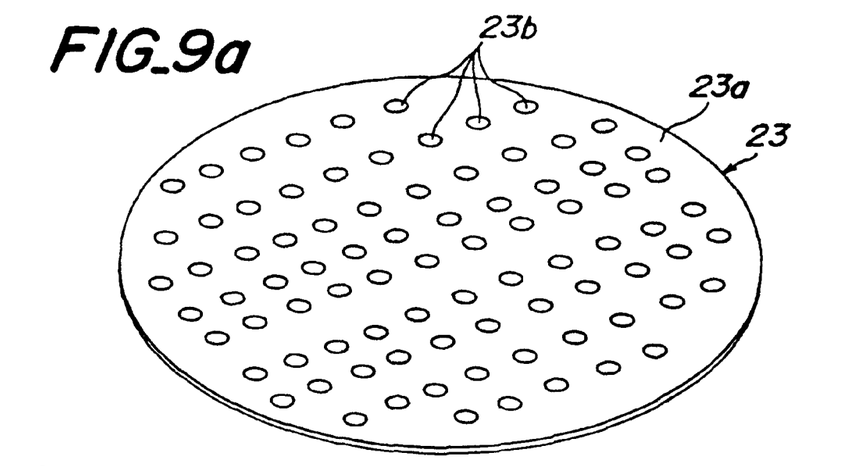
FIGS. 9a–9c are perspective views of various embodiments of a plate-shaped bulk electrode to be embedded in the ceramic member, respectively.
Figure 9B:
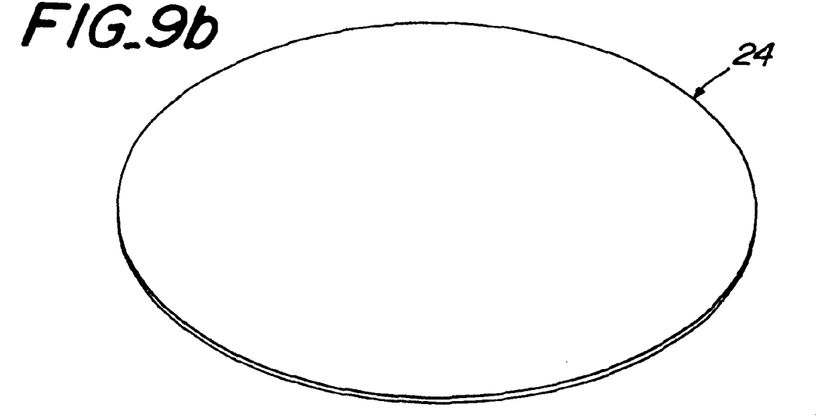

FIG. 9a is a perspective view of a punching metal 23 usable as a metal electrode. The punching metal 23 is circular and is formed by forming many circular holes 23b in a circular plate 23a in a rectangular arrangement. FIG. 9b is a perspective view of a circular thin sheet 24 usable as a metal electrode.

Figure 9C:
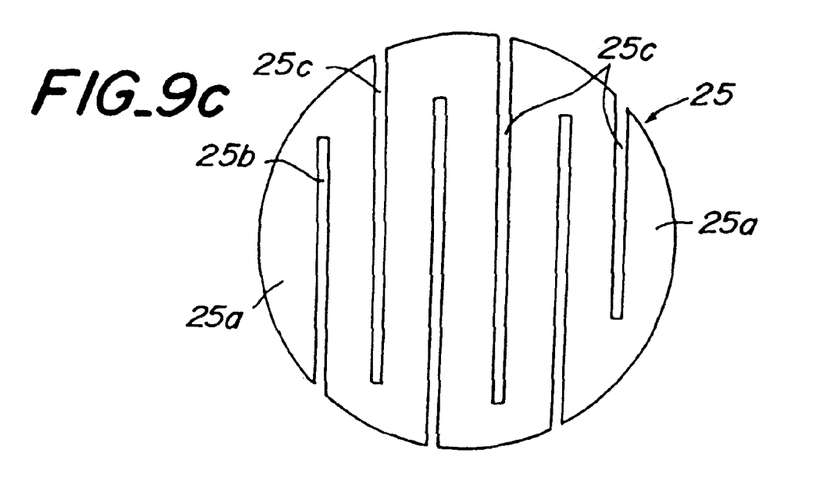

FIG. 9c is a plan view of a thin sheet 25 usable as a metal electrode. In the thin sheet 25 are formed six rows in total of straight slender slits 25b and 25c in parallel to each other. Among these rows, three rows of the slits 25b are opened downward in FIG. 9c and the other three rows of the slits 25c are opened upward. The slits 25b and 25c are alternately arranged to each other. By adopting such a configuration is formed an elongated electrically conductive path on the thin sheet. Terminals (not shown) are connected to both ends 25a of the electrically conductive path, respectively.

The joint structure according to the invention may be applied to a device placed in the semiconductor-manufacturing apparatus using a halogen type corrosive gases and ozone gas as a film-forming gas or an etching gas.

As such a device, mention may be made of a heater comprising a ceramic substrate and a resistance heating element embedded therein, an electrostatic chuck comprising a ceramic substrate and an electrode for an electrostatic chuck embedded therein, a heater provided with an electrostatic chuck comprising a ceramic substrate and a resistance heating element and an electrode for an electrostatic chuck embedded therein, a high-frequency generating electrode device comprising a ceramic substrate and a plasma-generating electrode embedded therein, a high-frequency generating electrode device comprising a ceramic substrate and a plasma-generating electrode and a resistance heating element embedded therein and the like.

In the invention, the material of the ceramic member is not limited, but aluminum nitride and alumina are favorable in the apparatus using a fluorine type halogen gas. And also, the material of the metal member is not limited, but a high melting point metal such as nickel, molybdenum, tungsten, platinum, rhodium or an alloy thereof is particularly favorable.

The material of the electrically conductive joint layer is not limited, but it is preferable to have a high airtightness and a small electrical resistance. From this point, a metallic brazing material is particularly preferable. A chemical composition of such a brazing material is not particularly limited.

Particularly, the brazing material is preferable to have a good joint strength and a high wettability to the ceramic member per se. That is, when the basic material of the ceramic member is alumina or aluminum nitride, it is favorable to use a brazing material comprising one of Cu, Ni, Ag and Al as a main ingredient, 0.3–20% by weight of an active metal selected from the group consisting of Mg, Ti, Zr and Hf and not more than 50% by weight of a third ingredient. However, it is desirable that Ag type brazing material is not used in applications requiring a corrosion resistance to the halogen type corrosive gas because it is low in the corrosion resistance.

As the third ingredient, it is favorable to use at least one of Si, Al, Cu and In, which do not influence on the main ingredient. Particularly, it is preferable that when the main ingredient of the brazing material is Al, the joining is carried out at a low temperature and thermal stress after the joining is small.

When the amount of the active metal compounded is less than 0.3% by weight, the wettability is poor and the joining may not be conducted, while when it exceeds 20% by weight, a reaction layer formed at a joint interface becomes thick and cracks may be created. For this reason, the amount of the active metal is 0.3–20% by weight. Further, when the total amount of the third ingredient compounded exceeds 50% by weight, an intermetallic compound becomes much and cracks may be created at the joint interface. For this reason, the amount of the third ingredient is not more than 50% by weight. Moreover, the third ingredient may not be contained.

The amount of the metal as a main ingredient of the brazing material is the remainder obtained by subtracting the sum of the amounts of the active metal and third ingredient from 100% by weight of the brazing material.

Moreover, it is more preferable that a film of at least one metal selected from copper, aluminum and nickel is formed on the bottom face $4a$ of the housing hole 4 or the surface of the brazing material opposed to the bottom face $4a$ by spattering, vapor deposition, friction pressure welding, plating, insertion of metal foil or the like in the joining. Such a film has an effect of improving the wettability to the brazing material.

Alternatively, it is more preferable that a film of at least one metal selected from magnesium, titanium, zirconium and hafnium is formed on the bottom face $4a$ of the housing hole 4 or the surface of the brazing material opposed to the bottom face $4a$ by spattering, vapor deposition, friction pressure welding, plating, insertion of metal foil or the like in the joining. Such a film has an effect of improving the reaction to the brazing material. The thickness of such a metal film is favorable to be 0.5–5 $\mu$m.

In each embodiment as shown in FIGS. 4, 5 and 6, a distance p of a gap 9 between the side wall face of the metal member and the side wall face $4b$ of the housing hole 4 is preferable to be 0.2–1.0 mm. When the distance p is less than 0.2 mm, the electrically conductive joint layer is liable to rise upward in the gap 9 through capillarity and the effect of mitigating residual stress of the joint material is less and hence cracks are liable to occur in the ceramic member. On the other hand, when the distance p exceeds 1.0 mm, the metal member 5 is apt to be removed when stress is applied to the metal member 5 in the direction of arrow A (see FIG. 1).

As the film 36 to be formed on the surface of the metal member, use may be made of a film having a wettability by the electrically conductive joint layer lower than that of the metal constituting the metal member thereby, which includes the followings.

(1) A metal oxide film formed by oxidation of a metal constituting the metal member, a metal nitride film formed by nitriding of a metal constituting the metal member, or a metal carbide film formed by carbonizing of a metal constituting the metal member. The use of the films formed by oxidation, nitriding and carbonizing of the metal member is particularly favorable because the film is hardly peeled off from the metal member at heat brazing stage or by heat cycle applied to the joint portion according to the invention using the electrostatic chuck or the like and the thickness and physical properties of the film become easily uniform. Among them, the metal oxide film is more preferable.

The metal oxide film can most easily be obtained by subjecting the metal member to a heat treatment in air. Further, the metal oxide film, metal nitride film and metal carbide film may be formed by the well-known method such as a treatment with chemicals such as acid, alkali and the like.

(2) A boron nitride film or carbon film. This film is hardly peeled off from the metal member at heat brazing stage or by heat cycle applied to the joint portion according to the invention, so that it is also preferable.

(3) A film of metal oxide, carbide or nitride obtained by a treatment other than the oxidation, carbonizing or nitriding of the metal member. For example, this film may be obtained by applying a paste containing a metal oxide, metal nitride or metal carbide to a given portion of the metal member and then heating the resulting coated layer. In this case, Ti, Al and Mg are particularly preferable as the metal.

The following examples are given in illustration of the invention and are not intended as limitations thereof.

(COMPARATIVE EXAMPLE)

An electrode apparatus 1 for generating plasma is manufactured according to procedures referring to FIG. 1. In this case, a wire mesh obtained by knitting molybdenum wires of 0.12 mm in diameter at a density of 50 wires per 1 inch is used as a reticulate electrode 2. This wire mesh is embedded in a pre-shaped body of aluminum nitride powder.

The pre-shaped body is placed in a mold and hermetically sealed with a carbon foil. At such a state, the pre-shaped body is fired by hot-pressing at a temperature of 1950° C. and a pressure of 200 kg/cm$^2$ for 2 hours to obtain a sintered body. The sintered body has a relative density of not less than 98.0%.

The thus obtained electrode apparatus 1 for generating plasma has a diameter of 200 mm and a thickness of 8 mm. A housing hole 4 having a diameter of 5 mm and a depth of 8 mm is formed in the sintered body by means of a machining center from the back surface side of the sintered body to expose the reticulate electrode 2 in the bottom face 4a of the housing hole 4. A titanium foil 6 having a diameter of 6 mm and a thickness of 5 μm is placed on the bottom face 4a of the housing hole 4.

A brazing material plate 16 of pure Ag having a thickness of 200 μm is arranged in the housing hole and then a metal member 5 of nickel having a length of 6 mm is inserted into the housing hole 4. In the center of the metal member 5 is formed a screw hole of M3 at a depth of 2 mm in order to conduct torque test after the joining. The brazing is carried out by heating at a temperature of 970° C. under vacuum while applying a load of 50 g to the metal member 5.

Thus, a joint structure as shown in FIG. 1 is obtained. A test of applying torque to the metal member 5 in the direction of arrow A is conducted with respect to the joint structure. As a result, a maximum torque applicable without disengagement of the metal member 5 is 5 kg/cm.

(INVENTION EXAMPLE)

An electrode apparatus 1 for generating plasma according to the invention is manufactured according to procedures referring to FIGS. 3 and 4. Moreover, the reticulate electrode 2 and the sintered body as a ceramic member are the same as in the comparative example.

A housing hole 4 having a diameter of 5 mm and a depth of 8 mm is formed by means of a machining center from the back surface side of the sintered body to expose the reticulate electrode 2 in the bottom face 4a of the housing hole 4. Then, a titanium foil 6 having a diameter of 6 mm and a thickness of 5 μm is placed on the bottom face 4a of the housing hole 4. A brazing material plate 16 of pure Ag having a thickness of 200 μm is arranged in the housing hole.

On the other hand, an oxide film 36 is formed on the surface of the metal member 5 of nickel by heating in air at a temperature of 1000° C. for 2 hours as shown in FIG. 2a. Then, the film 36 is removed off from the top face 5c, bottom face 5a and C-chamfered face 5d by a sand paper method to form a metal composite member 13A as shown in FIG. 2b.

As shown in FIG. 3, the metal composite member 13A is inserted into the housing hole 4. In the center of the metal composite member 13A is formed a screw hole of M3 at a depth of 2 mm in order to conduct torque test after the joining. The brazing is carried out by heating at a temperature of 970° C. under vacuum while applying a load of 50 g to the metal composite member 13A.

Thus, a joint structure as shown in FIG. 4 is obtained. A test of applying torque to the metal composite member 13A in the direction of arrow A is conducted with respect to the joint structure. As a result, a maximum torque applicable without disengagement of the metal composite member 13A is 10 kg/cm.

As seen from the above, according to the invention, the joint strength of the metal member can be improved in the joint structure comprising the metal member and the ceramic member provided with the housing hole for accommodating at least a part of the metal member.

What is claimed is:

1. A joint structure of a metal member and a ceramic member having a housing hole for accommodating at least a part of the metal member therein, an electrically conductive joint layer joining the metal member to the ceramic member is formed between a bottom face of the metal member and a bottom face of the housing hole, and a film which is less wet than a metal of the metal member thereby is formed on at least a part of a wall face of the metal member.

2. A joint structure according to claim 1, wherein a film is formed over the full side wall face of the metal member.

3. A joint structure according to claim 1, wherein the metal member is provided on its lower portion with a C-chamfered face or a round chamfered face, and the film is not formed on the C-chamfered face or round chamfered face.

4. A joint structure according to claim 1, wherein an electrically conductive member is embedded in the ceramic member by integrally sintering, a part of the electrically conductive member is exposed at the bottom face of the housing hole, and the exposed portion of the electrically conductive member is electrically connected to the bottom face of the metal member through the electrically conductive joint layer.

5. A joint structure according to claim 1, wherein a plate-shaped metal electrode and a powdery sintered body of a low thermal expansion metal are embedded in the ceramic member, the metal electrode is made of a bulk member having many small spaces, the powdery sintered body is electrically connected to the metal electrode, a part of the powdery sintered body is exposed from the bottom face of the housing hole, and the exposed portion of the powdery sintered body is electrically connected to the bottom face of the metal member through the electrically conductive joint layer.

6. A joint structure according to claim 1, wherein the film is selected from the group consisting of a metal oxide film formed by oxidation of a metal of the metal member, a metal nitride film formed by nitriding of a metal of the metal member and a metal carbide film formed by carbonizing of a metal of the metal member.

7. A joint structure according to claim 1, wherein a material of the film is selected from the group consisting of boron nitride and carbon.

8. A method of producing a joint structure of a metal member and a ceramic member having a housing hole for accommodating at least a part of the metal member therein, wherein the metal member is accommodated in the housing hole, and an electrically conductive joint layer joining the metal member to the ceramic member is formed between a bottom face of the metal member and a bottom face of the housing hole, characterized in that a film which is less wet than a metal of the metal member thereby is formed on at least a part of side wall face of the metal member, the metal member is inserted into the housing hole, an electrically conductive joint member for joining the metal member to the ceramic member is arranged between the bottom face of the metal member and the bottom face of the housing hole, and at least the electrically conductive joint member is heated to form the electrically conductive joint layer.

* * * * *